(12) United States Patent
Radu et al.

(10) Patent No.: US 9,905,531 B2
(45) Date of Patent: Feb. 27, 2018

(54) METHOD FOR PRODUCING COMPOSITE STRUCTURE WITH METAL/METAL BONDING

(71) Applicant: Soitec, Bernin (FR)

(72) Inventors: Ionut Radu, Crolles (FR); Marcel Broekaart, Theys (FR); Arnaud Castex, Grenoble (FR); Gweltaz Gaudin, Grenoble (FR); Gregory Riou, Crolles (FR)

(73) Assignee: Soitec, Bernin (FR)

( * ) Notice: Subject to any disclaimer, the term of this patent is extended or adjusted under 35 U.S.C. 154(b) by 325 days.

(21) Appl. No.: 14/411,741

(22) PCT Filed: Jun. 5, 2013

(86) PCT No.: PCT/IB2013/001250
§ 371 (c)(1),
(2) Date: Dec. 29, 2014

(87) PCT Pub. No.: WO2014/001868
PCT Pub. Date: Jan. 3, 2014

(65) Prior Publication Data
US 2015/0179603 A1    Jun. 25, 2015

(30) Foreign Application Priority Data

Jun. 28, 2012 (FR) .................................... 12 56161

(51) Int. Cl.
*H01L 23/00*    (2006.01)
*H01L 21/18*    (2006.01)
(Continued)

(52) U.S. Cl.
CPC ............ *H01L 24/83* (2013.01); *H01L 21/187* (2013.01); *H01L 21/30604* (2013.01);
(Continued)

(58) Field of Classification Search
None
See application file for complete search history.

(56) References Cited

U.S. PATENT DOCUMENTS 7,602,070 B2 * 10/2009 Tong ..................... B23K 20/02
257/734
7,682,933 B1 * 3/2010 Loomis ................... H01L 25/50
257/E21.122
(Continued)

FOREIGN PATENT DOCUMENTS

CN    101088154 A    12/2007
CN    102017125 A    4/2011
(Continued)

OTHER PUBLICATIONS

Liau, Z. L., "Semiconductor wafer bonding via liquid capillarity", Applied Physics Letters, vol. 77, No. 5, 2000, p. 651-653.*
(Continued)

*Primary Examiner* — Devang R Patel
(74) *Attorney, Agent, or Firm* — TraskBritt

(57) ABSTRACT

Method for producing a composite structure comprising the direct bonding of at least one first wafer with a second wafer, and comprising a step of initiating the propagation of a bonding wave, where the bonding interface between the first and second wafers after the propagation of the bonding wave has a bonding energy of less than or equal to 0.7 $J/m^2$. The step of initiating the propagation of the bonding wave is performed under one or more of the following conditions: placement of the wafers in an environment at a pressure of less than 20 mbar and/or application to one of the two wafers of a mechanical pressure of between 0.1 MPa and 33.3 MPa. The method further comprises, after the step of initiating the propagation of a bonding wave, a step of determining the level of stress induced during bonding of the two wafers, the level of stress being determined on the basis of a stress (Continued)

parameter Ct calculated using the formula Ct=Rc/Ep, where: Rc corresponds to the radius of curvature (in km) of the two-wafer assembly and Ep corresponds to the thickness (in μm) of the two-wafer assembly. The method further comprises a step of validating the bonding when the level of stress Ct determined is greater than or equal to 0.07.

9 Claims, 3 Drawing Sheets

(51) Int. Cl.
  *H01L 21/306*   (2006.01)
  *H01L 21/66*   (2006.01)
(52) U.S. Cl.
  CPC ........ *H01L 21/30625* (2013.01); *H01L 22/12* (2013.01); *H01L 23/562* (2013.01); *H01L 24/32* (2013.01); *H01L 2224/2916* (2013.01); *H01L 2224/2918* (2013.01); *H01L 2224/29124* (2013.01); *H01L 2224/29155* (2013.01); *H01L 2224/29169* (2013.01); *H01L 2224/29171* (2013.01); *H01L 2224/29176* (2013.01); *H01L 2224/29181* (2013.01); *H01L 2224/29184* (2013.01); *H01L 2224/83201* (2013.01); *H01L 2224/83203* (2013.01); *H01L 2224/83895* (2013.01); *H01L 2924/01014* (2013.01); *H01L 2924/0504* (2013.01); *H01L 2924/10253* (2013.01); *H01L 2924/201* (2013.01); *Y10T 428/12493* (2015.01); *Y10T 428/12639* (2015.01); *Y10T 428/12646* (2015.01); *Y10T 428/12653* (2015.01); *Y10T 428/12674* (2015.01)

(56) References Cited

U.S. PATENT DOCUMENTS

| 8,530,334 | B2* | 9/2013 | Lagahe | H01L 21/2007 |
| | | | | 438/458 |
| 2004/0262772 | A1 | 12/2004 | Shriram | |
| 2009/0280595 | A1* | 11/2009 | Broekaart | C03C 27/00 |
| | | | | 438/66 |
| 2010/0122762 | A1* | 5/2010 | George | H01L 21/187 |
| | | | | 156/64 |
| 2011/0287604 | A1 | 11/2011 | Castex et al. | |
| 2012/0006463 | A1 | 1/2012 | Gweltaz | |

FOREIGN PATENT DOCUMENTS

| CN | 102376623 A | 3/2012 |
| EP | 1936667 A1 | 6/2008 |
| EP | 2405465 A1 | 1/2012 |

OTHER PUBLICATIONS

International Search Report for International Application No. PCT/IB2013/001250 dated Aug. 12, 2013, 3 pages.
Chinese First Office Action for Chinese Application No. 201380034211.0 dated Jun. 30, 3016, 6 pages.
International Written Opinion for International Application No. PCT/IB2013/001250 dated Aug. 12, 2013, 5 pages.
Chinese First Search for Chinese Application No. 201380034211.0 dated Jun. 13, 3016, 1 page.
French Search Report for French Application No. 1256161, dated Jan. 8, 2013, 2 pages.

* cited by examiner

METHOD FOR PRODUCING COMPOSITE STRUCTURE WITH METAL/METAL BONDING

CROSS-REFERENCE TO RELATED APPLICATIONS

This application is a national phase entry under 35 U.S.C. § 371 of International Patent Application PCT/IB2013/001250, filed Jun. 5, 2013, designating the United States of America and published in English as International Patent Publication WO 2014/001868 A1 on Jan. 3, 2014, which claims the benefit under Article 8 of the Patent Cooperation Treaty and under 35 U.S.C. § 119(e) to French Patent Application Serial No. 1256161, filed Jun. 28, 2012, the disclosure of each of which is hereby incorporated herein in its entirety by this reference.

TECHNICAL FIELD

The disclosure relates to the fabrication of structures comprising the direct bonding (or molecular adhesion bonding) of at least one first wafer with a second wafer, where the resulting bonding interface has a limited bonding energy of less than or equal to 0.7 J/m$^2$, even after a bonding reinforcement bake at 500° C.

BACKGROUND

There are a certain number of cases of direct bonding where the bonding energy resulting at the bonding interface is relatively limited. This is the case, for example, when the direct bonding is performed between two wafers made of or covered with a metallic material having a low self-diffusion coefficient D, i.e., D<10$^{-50}$ m$^2$/s, such as tungsten, aluminium, tantalum, iron, molybdenum, chromium, ruthenium, nickel, platinum, etc. There are other types of direct bonding, such as hydrophobic Si/Si bonds (that is, without a bonding oxide layer), SiN/SiN bonds, or other combinations of materials, for which the bonding energy remains limited. All of these bonds are characterized by a bonding energy of typically less than 0.7 J/m$^2$, even after a bonding reinforcement bake at 500° C., whereas the bonding energy in the case of oxide-to-oxide bonding, for example, is typically greater than 1 J/m$^2$.

Owing to this low bonding energy, there are risks of partial or even total disbonding between the two wafers in the course of subsequent treatments, more particularly, during treatments that involve temperature increases.

This partial or complete disbonding is caused by an increase in the stresses at the bonding interface, which opposes the bonding force. The stresses at the bonding interface that appear during increases in temperature are caused, in particular, by the difference in coefficient of thermal expansion between the two wafers, or by the expansion of the metallic materials present at the bonding faces. Since this primary source of stresses is associated directly with the materials present on the bonding faces, it is not easy to reduce them.

The applicant has also found, however, that the stresses present at the bonding interface also originate from the step of bonding itself. The initiation of mechanical pressure between the two wafers in order to initiate the propagation of a bonding wave gives rise to the accumulation of a certain quantity of energy, which opposes the bonding energy and that may, consequently, be responsible for the disbonding of the wafers.

Beyond a certain level of stress at the bonding interface, the risk of disbonding during subsequent treatments of the assembly (thermal, chemical or chemomechanical treatments) becomes very high.

Consequently there exists both a need to reduce stresses stored at the time of bonding, and a need to evaluate a level of stresses at the bonding interface that can be used as a basis for avoiding the risks of disbonding.

BRIEF SUMMARY

For this purpose, the disclosure provides a method for producing a composite structure, comprising the direct bonding of at least one first wafer with a second wafer, the method comprising a step of initiating the propagation of a bonding wave, where the bonding interface between the first and second wafers after the propagation of the bonding wave has a bonding energy of less than or equal to 0.7 J/m$^2$, wherein the step of initiating the propagation of the bonding wave is performed under one or more of the following conditions:
 placement of the wafers in an environment at a pressure of less than 20 mbar,
 application to one of the two wafers of a mechanical pressure of between 0.1 MPa and 33.3 MPa,
and in that the method further comprises, after the step of initiating the propagation of a bonding wave:
 a step of determining the level of stress induced during the bonding of the two wafers, the level of stress being determined on the basis of a stress parameter Ct, which is calculated using the following formula:

$$Ct = Rc/Ep$$

where:
 Rc corresponds to the radius of curvature (in km) of the two-wafer assembly and
 Ep corresponds to the thickness (in μm) of the two-wafer assembly,
and a step of validating the bonding when the stress parameter Ct determined is greater than or equal to 0.07.

The method of the disclosure thus proposes not only a reduction in the stresses that may be accumulated at the bonding interface during the method, by reducing the deformations that are caused, but also the evaluation of the residual stress level and the validation or otherwise of the bonding in dependence on this evaluation.

By virtue of the method of the disclosure, it is possible to qualify the wafer assemblies obtained by direct metal-metal bonding in such a way as to continue treatment of the assembly, in other words, the fabrication of a structure, only when the quality of the bonding is sufficient to prevent disbonding in the course of subsequent treatments. In this way, a significant reduction is achieved in reject rate during the fabrication of structures, thereby increasing productivity.

According to a first aspect of the method of the disclosure, during the step of initiating the propagation of a bonding wave, at least one of the two wafers is held flattened on a support having deviations in planarity of less than or equal to 2 μm.

According to a second aspect of the method of the disclosure, each wafer comprises on its bonding face a material selected from at least the following: tungsten, aluminium, tantalum, iron, molybdenum, chromium, ruthenium, nickel, platinum, silicon nitride and silicon. The wafer is made from one of these materials or is covered on its bonding face with one of these materials.

According to a third aspect of the method of the disclosure, at least one of the two wafers is composed of a silicon substrate covered with a layer of material selected from at least the following: tungsten, aluminium, tantalum, iron, molybdenum, chromium, ruthenium, nickel, platinum, silicon nitride and silicon, and forming the bonding face of the wafer.

According to a fourth aspect of the disclosure, the method further comprises, in the case of validation of the level of stress, at least one step of treating the two-wafer assembly that is selected from at least the following:
 a thermal treatment of the assembly, performed at a temperature of less than or equal to 500° C.,
 a chemical or chemomechanical thinning of one of the two wafers.

The disclosure likewise provides a composite structure comprising at least one first wafer bonded to a second wafer, each wafer comprising on its bonding face a metallic material, where the bonding interface between the first and second wafers has a bonding energy of less than or equal to 0.7 J/m², wherein the structure has a stress parameter Ct after bonding of the two wafers of greater than or equal to 0.07, the stress parameter Ct being calculated using the following formula:

$$Ct = Rc/Ep$$

where:
Rc corresponds to the radius of curvature (in km) of the two-wafer assembly,
Ep corresponds to the thickness (in μm) of the two-wafer assembly.

According to a first aspect of the structure of the disclosure, each wafer comprises on its bonding face a metallic material selected from at least the following: tungsten, aluminium, tantalum, iron, molybdenum, chromium, ruthenium, nickel, platinum, silicon nitride and silicon. The wafer is made from one of these materials or is covered on its bonding face by one of these materials.

According to a second aspect of the structure of the disclosure, at least one of the two wafers is composed of a silicon substrate covered with a layer of material selected from at least the following: tungsten, aluminium, tantalum, iron, molybdenum, chromium, ruthenium, nickel, platinum, silicon nitride and silicon, and forming the bonding face of the wafer.

BRIEF DESCRIPTION OF THE FIGURES

Other features and advantages of the disclosure will emerge from the following description of particular embodiments of the disclosure, which are given as non-limitative examples, with reference to the appended drawings, in which.

DETAILED DESCRIPTION

Figure 1A:
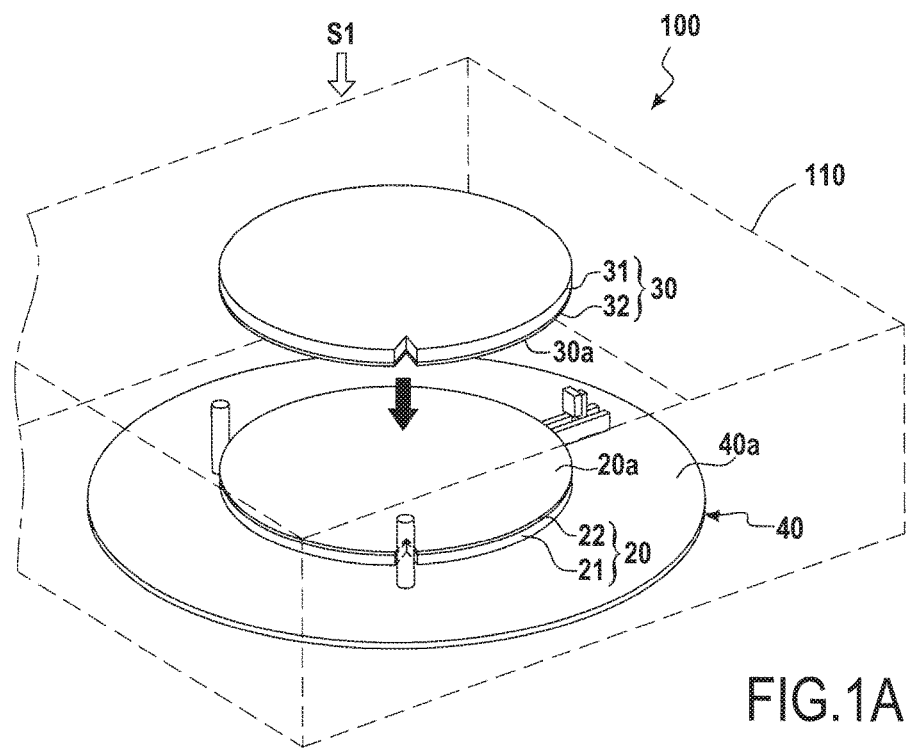
FIGS. 1A and 1B are schematic views of a method of direct bonding in accordance with one embodiment of the disclosure.

The disclosure applies, generally speaking, to the production of composite structures, comprising at least the direct bonding of a first substrate or wafer to a second substrate or wafer, where the resulting bonding interface has a limited bonding energy, namely, a bonding energy of less than or equal to 0.7 J/m², even after a bonding reinforcement bake at 500° C. Such limitation of bonding energy following production of a direct bond comes about, in particular, in the following cases:
 when the bonding faces are made of metallic material or covered with a metallic material having a low self-diffusion coefficient D, i.e., of less than $10^{-50}$ m²/s, such as tungsten, aluminium, tantalum, iron, molybdenum, chromium, ruthenium, nickel, platinum, etc.;
 when the bonding faces are made of silicon or covered with silicon and when hydrophobic bonding is performed, i.e., without using an oxide-type bonding layer;
 when the bonding faces are made of silicon nitride or covered with silicon nitride. The wafers for assembly may, in particular, have a diameter of 100 mm, 150 mm, 200 mm or 300 mm.

Direct, or molecular-adhesion, bonding is a technique well known per se. To recall, the principle of direct bonding is based on the contacting of two surfaces directly, in other words, without the use of a specific material (adhesive, wax, braze, etc.). Such an operation requires that the surfaces to be bonded together should be sufficiently smooth, free of any particles or contamination, and that they be sufficiently close together to initiate a contact, typically at a distance of less than a few nanometers. In this case, the attractive forces between the two surfaces are quite high, so as to trigger molecular adhesion (bonding induced by the combination of attractive forces (van der Waals forces) of electronic interaction between atoms or molecules of the two surfaces to be bonded).

The molecular adhesion is produced by initiation of at least one contact point on a wafer in intimate contact with another wafer, so as to trigger the propagation of a bonding wave from this contact point. The term "bonding wave" is used here to refer to the bonding or molecular adhesion front that propagates from the point of initiation and that corresponds to the spreading of the attractive forces (van der Waals forces) from the contact point over the entire surface of intimate contact between the two wafers (bonding interface). The contact point is typically initiated by applying a mechanical pressure to the exposed surface of one of the two wafers.

In accordance with the disclosure and in order to reduce the stresses accumulated at the time of bonding, the initiation of the propagation of a bonding wave between two wafers to be assembled, having bonding faces made of a material that does not result in a bonding energy of greater than 0.7 J/m², as described above, is accomplished by placing the wafers in an environment at a pressure of less than 20 mbar and/or by applying to one of the two wafers a mechanical pressure of between 0.1 MPa and 33.3 MPa.

Where the propagation of a bonding wave is initiated by placing the wafers in a low-pressure environment, and as shown in FIG. 1A, a first wafer or substrate 20 is placed into a chamber 110 of a bonding machine 100, the chamber comprising a substrate carrier device 40. In the example described here, the first wafer 20 is composed of a silicon substrate 21 comprising a layer 22 of metallic material having a low self-diffusion coefficient and forming the bonding face 20a of the wafer 20. The layer 22 here is composed of tungsten. The substrate carrier device 40 comprises a support plate 40a, which exhibits deviations from planarity of preferably less than or equal to 2 microns.

The support plate 40*a* holds the first wafer 20, by means, for example, of an electrostatic or suction system, in association with the support plate 40*a*, or by simple gravity, for the purpose of its assembly by molecular adhesion to a second wafer or substrate 30, composed of a silicon substrate 31 comprising a tungsten layer 32, forming the bonding face 30*a* of the wafer 30. The associated systems for holding the wafer (electrostatic or by suction) are used to the extent that it has been verified that they do not deform the wafer, so as not to give rise to any increase in the problems of accumulation of stresses at the bonding interface.

Figure 1B:
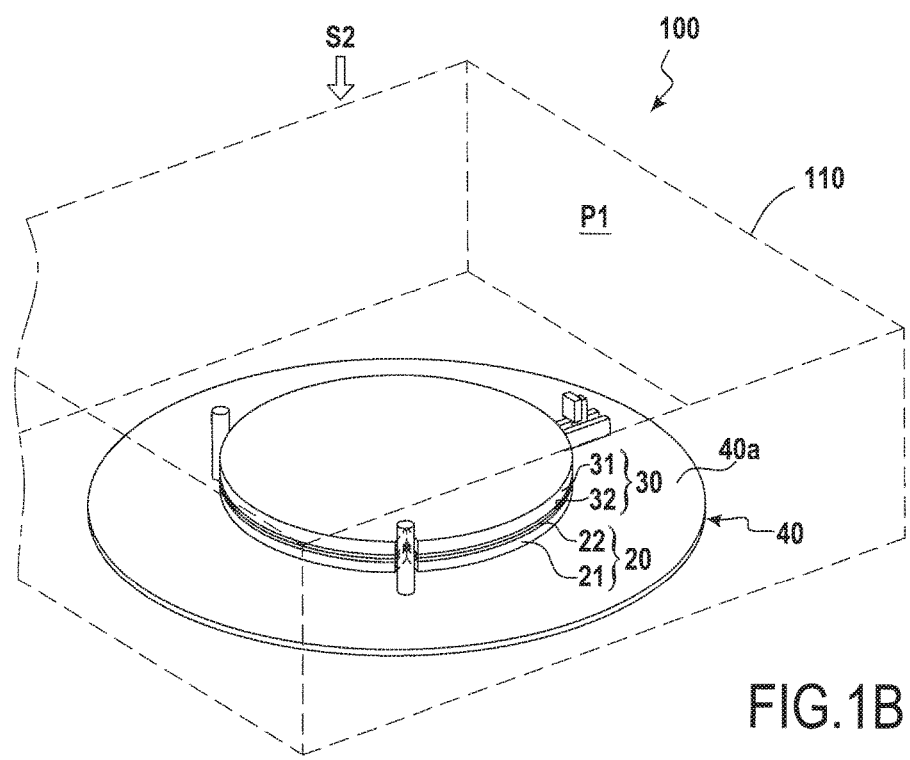

As illustrated in FIG. 1B, the wafer 30 is then set down on the wafer 20, so as to bring the bonding faces 20*a* and 30*a*, respectively, of the wafers 20 and 30 opposite one another. Alignment operations may be performed, moreover, during the setting-down of the wafer 30 onto the wafer 20.

The wafers 20 and 30 are placed into the hermetic chamber 110, which is equipped with partial vacuum means such as a vacuum pump or similar (not shown in FIG. 1B).

When wafers 20 and 30 are ready to be bonded, the pressure in the chamber 110 is lowered to a pressure P1 of less than or equal to 20 mbar, preferably less than 5 mbar, so as to initiate the propagation of a bonding wave between the two wafers. The pressure of the environment into which the wafers are placed during the initiation of the propagation of a bonding wave is constant or not (i.e., potentially variable during the initiation step). The propagation of a bonding wave is initiated spontaneously here, in other words, without application of mechanical pressure on the wafers, thereby minimizing the stresses during bonding and reducing the level of stored stress at the bonding interface.

Where the propagation of a bonding wave is initiated by application of a mechanical pressure, the disclosure proposes controlling the mechanical pressure applied at the contact point so as to limit the stresses in this zone, while allowing the initiation and propagation of a bonding wave between the two wafers in contact. In accordance with the disclosure, the pressure applied at the contact point is between 0.1 megapascal (MPa) and 33.3 MPa. The initiation point may be located anywhere on the wafer. It is preferably situated close to the center of the wafer. The surface area of the zone of application of this pressure is typically less than a few mm$^2$, for example, 1 mm$^2$. Larger application surface areas are possible but avoided because of the risk of too great a contact surface area (greater than 5 mm$^2$, for example) leading to an increase in the deformations and in the level of stored stresses at the bonding interface. The application of a mechanical pressure of this kind is sufficient to initiate a contact point between two wafers and, consequently, to allow the propagation of a bonding wave over the entire surface of contact between the wafers, without giving rise to excessive stresses. Accordingly, by controlling the mechanical pressure applied to initiate the contact point, the deformations caused in the wafer are reduced. The pressure applied at the contact point is preferably less than 10 MPa, and still more preferably, this pressure is between 0.1 to 5 MPa.

The duration for which the mechanical pressure is applied corresponds at least to the minimum duration allowing the bonding wave propagation phenomenon to be activated. This minimum duration corresponds substantially to the duration required by the bonding wave to propagate over the surface of contact between the wafers. The duration of application of the mechanical pressure varies generally between 1 and 10 seconds, typically 5 seconds, for assembly of wafers having a diameter of 200 mm.

Figure 2:
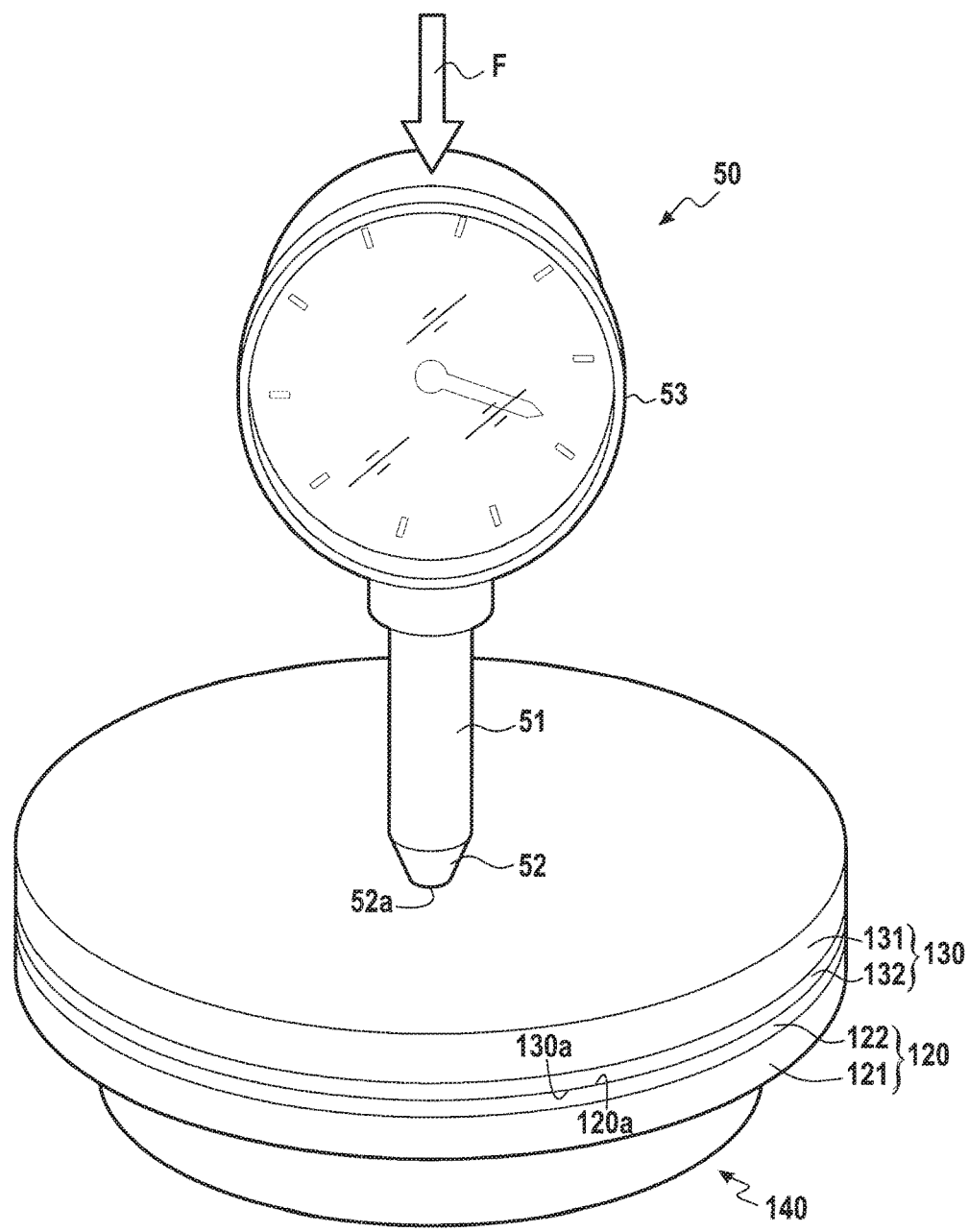
FIG. 2 is a schematic view of a method for direct bonding in accordance with another embodiment of the disclosure.

The controlled application of the mechanical pressure may be performed by means of a tool. In FIG. 2, a first wafer or substrate 120 is placed into a bonding machine comprising a support plate 140 that has deviations from planarity of preferably less than or equal to 2 microns. The support plate 140 holds the first wafer 120, by means, for example, of an electrostatic or suction system combined with the support plate 140, or by simple gravity, for the purpose of its assembly by molecular adhesion with a second wafer or substrate 130. As in the example described above, the wafer 120 or 130, respectively, is composed of a silicon substrate 121 or 131, respectively, covered with a tungsten layer 122 or 132, respectively, forming the bonding face 120*a* or 130*a*, respectively, of the wafer 120 or 130.

The bonding faces 121*a* and 131*a* of the wafers 120 and 130 are brought into intimate contact with one another. The initiation of a contact point for the molecular adhesion is performed by means of a tool 50. As illustrated very schematically in FIG. 2, the tool 50 comprises a support element 51, such as a stylus, and a spring gauge 53. The support element 51 is connected to the spring gauge 53 and comprises a free end 52 by which a mechanical pressure is exerted on the wafer 130 so as to initiate a contact point between the two wafers 120 and 130. The end 52 has a contact surface area 52*a* of between 0.3 mm$^2$ and 1 mm$^2$. When the value of the contact surface area 52*a* of the tool 50 with the wafer 130 is known, it is possible to apply a mechanical pressure of between 0.1 MPa and 33.3 MPa by controlling the supporting force F exerted by the tool on the wafer (supporting force=mechanical pressure×supporting surface area). The supporting force exerted by the end 52 on the wafer 130 is controlled by means of the spring gauge 53. This force is between 0.1 newton (N) and 10 N.

For example, when the desire is to use a tool whose end has a contact surface area of 1 mm$^2$ to apply a mechanical pressure of 3.5 MPa (a pressure sufficient to initiate a contact point and, consequently, a bonding wave between the two wafers), a supporting force is exerted of 3.5 N.

The support element and, more particularly, its end for contact with the wafer may be made of or covered with a material such as TEFLON®, silicone or a polymer. Generally speaking, the end of the support element is made of or covered with a material that is sufficiently rigid to apply the pressure in a controlled way. The reason is that too flexible a material could deform and lead to an imprecise contact surface area and, consequently, to a lack of precision of the pressure applied. Moreover, too stiff a material could lead to the formation of defects (indentations) at the surface of the wafer.

The method for initiation of molecular adhesion of the disclosure may be employed automatically in a bonding machine. In that case, the machine comprises a support element connected to an actuator (for example, a cylinder or a mechanical arm). The machine further comprises a force sensor (spring gauge, strain gauge, etc.) and a servo control for steering the actuator. The servo control steers the actuator in such a way as to control the mechanical pressure applied by the support element. More specifically, the servo control receives the data from the force sensor and compares it with a supporting force value predetermined as a function of the mechanical pressure that is desired to be applied and of the surface area of the support element end.

The means for initiating the propagation of a bonding wave as described above may be combined, which means that a mechanical pressure point may be applied between the two wafers at a supporting pressure of between 0.1 MPa and 33.3 MPa, while at the same time, the two wafers are placed into an environment maintained at a pressure of less than 20 mbar.

Before bonding is performed, the bonding faces of the wafers may be prepared, in particular, by means of chemical-mechanical polishing.

Once the direct bonding has been performed, the method of the disclosure further comprises a step of measuring the level of stress at the bonding interface between the two wafers, and a control step of determining whether the level of stress is acceptable to allow subsequent treatments to be applied to the two-wafer assembly without risk of disbonding.

For this purpose, the disclosure proposes evaluating the level of stress induced during bonding of the two wafers on the basis of a stress parameter Ct calculated using the following formula:

$$Ct = Rc/Ep \quad (1)$$

where:
Rc corresponds to the radius of curvature, in km, of the two-wafer assembly,
Ep corresponds to the thickness, in µm, of the two-wafer assembly.

Figure 3:
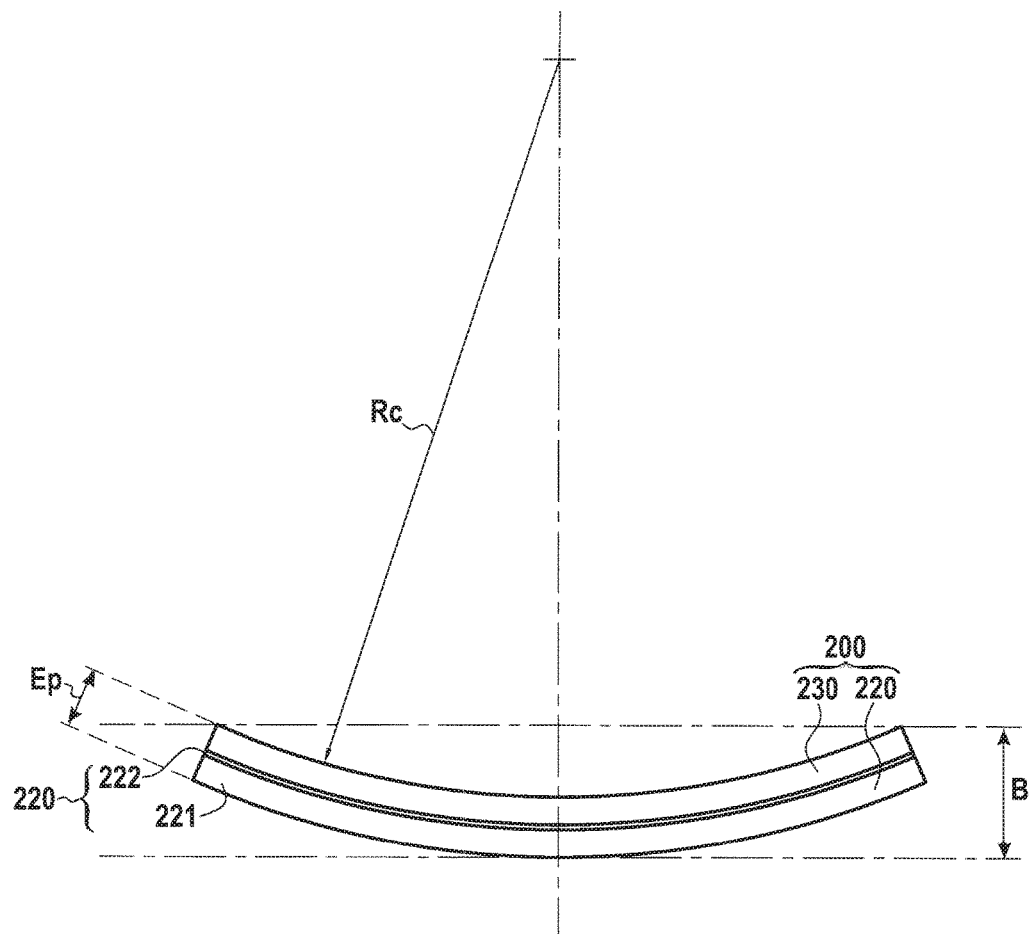
FIG. 3 shows the measurement of the parameters for calculating the level of stress at the bonding interface, in accordance with the disclosure.

FIG. 3 illustrates an assembly 200 produced by direct bonding of a first wafer 220, composed of a silicon substrate 221 covered on its bonding face with a tungsten layer 222, and a second wafer 230 made of tungsten. In order to determine the level of stress at the bonding interface between the wafers 220 and 230, a determination is made of the radius of curvature Rc presented by the assembly 200, by means of the following approximation formula:

$$Rc = D^2/8B$$

where:
B corresponds to the curvature or "bow," in µm, of the assembly,
D is the diameter, in mm, of the wafers in the assembly.

A measurement is made, moreover, of the thickness Ep of the assembly, corresponding to the cumulative thickness of the bonded wafers 220 and 230. The radius of curvature Rc is measured in km, whereas the thickness of the assembly is measured in µm. The stress parameter Ct is then calculated using the formula (1) given above.

When the stress parameter has been calculated, it is compared with a reference value Cref, which is 0.07. If the calculated stress level Ct is greater than 0.07, preferably greater than 0.15, bonding is validated in the sense that the stress level present within the assembly is sufficiently low to prevent disbonding of the wafers in the course of subsequent treatments and, more particularly, during thermal, chemical or chemical-mechanical treatments.

If the calculated stress parameter Ct is less than the reference level, bonding is not validated, allowing the defective batch to be removed from the fabrication process prior to the disbonding of the wafers during treatments carried out after bonding. The wafers in the rejected assembly may be disbonded and rebonded anew, to give a satisfactory level of stress.

When bonding is validated in accordance with the disclosure, the production of the composite structure can continue by the performance of one or more of the following treatments on the assembly:
thermal treatment performed at a temperature of less than or equal to 500° C.,
thinning of one of the two wafers by chemical etching or chemical-mechanical polishing of one of the two wafers,
deposition or growth of further layers on the assembly.

The table below shows results of simulation obtained in terms of level of stress for a plurality of batches, each corresponding to the assembly of two wafers by molecular adhesion.

| Batch | Wafer diameter (D) mm | Curvature (B) µm | Radius of curvature, assembly (Rc) km | Thickness, assembly µm | Stress parameter (Ct) |
|---|---|---|---|---|---|
| 1 | 100 | 8 | 156.25 | 1050 | 0.14881 |
| 2 | 100 | 16 | 78.125 | 1050 | 0.074405 |
| 3 | 100 | 50 | 25 | 1050 | 0.02381 |
| 4 | 100 | 100 | 12.5 | 1050 | 0.011905 |
| 5 | 100 | 1000 | 1.25 | 1050 | 0.00119 |
| 6 | 200 | 1 | 5000 | 1450 | 3.448276 |
| 7 | 200 | 23 | 217.391304 | 1450 | 0.149925 |
| 8 | 200 | 45 | 111.111111 | 1450 | 0.076628 |
| 9 | 200 | 100 | 50 | 1450 | 0.034483 |
| 10 | 200 | 1000 | 5 | 1450 | 0.003448 |
| 11 | 300 | 1 | 11250 | 1550 | 7.258065 |
| 12 | 300 | 10 | 1125 | 1550 | 0.725806 |
| 13 | 300 | 50 | 225 | 1550 | 0.145161 |
| 14 | 300 | 102 | 110.294118 | 1550 | 0.071157 |
| 15 | 300 | 1000 | 11.25 | 1550 | 0.007258 |

For batches 3, 4, 5, 9, 10 and 15, it is found that the calculated stress parameter is less than the reference value of 0.07, whereas the other batches have a stress parameter greater than this reference value.

The invention claimed is:

1. A method for producing a composite structure, comprising:
   direct bonding of a first wafer and a second wafer by initiating propagation of a bonding wave, wherein a bonding interface between the first and second wafers after the propagation of the bonding wave has a bonding energy of less than or equal to 0.7 J/m², wherein initiating the propagation of the bonding wave is performed under one or more of the following conditions:
      placement of the first and second wafers in an environment at a pressure of less than 20 mbar,
      application to one of the first and second wafers of a mechanical pressure of between 0.1 MPa and 33.3 MPa;
   after initiating the propagation of the bonding wave, determining a level of stress induced during bonding of the first and second wafers, the level of stress determined by a stress parameter Ct calculated by a formula:

$$Ct = Rc/Ep$$

where:
      Rc corresponds to a radius of curvature (in km) of a two-wafer assembly comprising the first and second wafers, and
      Ep corresponds to a thickness (in µm) of the two-wafer assembly;
   determining whether the stress parameter Ct is less than 0.07 or whether the stress parameter Ct is greater than or equal to 0.07;
   validating the bonding between the first and second wafers when the stress parameter Ct is determined to be greater than or equal to 0.07; and rejecting the first and second wafers when the stress parameter Ct is determined to be less than 0.07 such that the bonding between the first and second wafers is not validated.

2. The method according to claim 1, wherein at least one of the first and second wafers is held flattened on a support having deviations in planarity of less than or equal to 2 μm while initiating the propagation of the bonding wave.

3. The method according to claim 2, wherein each of the first and second wafers comprises, on its bonding face, a material selected from the group consisting of tungsten, aluminium, tantalum, iron, molybdenum, chromium, ruthenium, nickel, platinum, silicon nitride and silicon.

4. The method according to claim 3, wherein at least one of the first and second wafers comprises a silicon substrate covered with a layer of material selected from the group consisting of tungsten, aluminium, tantalum, iron, molybdenum, chromium, ruthenium, nickel, platinum, silicon nitride and silicon, and wherein the layer of material forms the bonding face of at least one of the first and second wafers.

5. The method according to claim 4, wherein validating the bonding between the first and second wafers comprises at least one step of treating the two-wafer assembly that is selected from the group consisting of:
   a thermal treatment of the assembly, performed at a temperature of less than or equal to 500° C.; and
   a chemical or chemical-mechanical thinning of one of the first and second wafers.

6. The method according to claim 1, wherein each of the first and second wafers comprises, on its bonding face, a material selected from the group consisting of tungsten, aluminum, tantalum, iron, molybdenum, chromium, ruthenium, nickel, platinum, silicon nitride and silicon.

7. The method according to claim 1, wherein at least one of the first and second wafers comprises a silicon substrate covered with a layer of material selected from the group consisting of tungsten, aluminum, tantalum, iron, molybdenum, chromium, ruthenium, nickel, platinum, silicon nitride and silicon, and wherein the layer of material forms the bonding face of the at least one of the first and second wafers.

8. The method according to claim 2, wherein at least one of the first and second wafers comprises a silicon substrate covered with a layer of material selected from the group consisting of tungsten, aluminum, tantalum, iron, molybdenum, chromium, ruthenium, nickel, platinum, silicon nitride and silicon, and wherein the layer of material forms the bonding face of at least one of the first and second wafers.

9. The method according to claim 1, wherein validating the bonding between the first and second wafers comprises at least one step of treating the two-wafer assembly that is selected from the group consisting of:
   a thermal treatment of the assembly, performed at a temperature of less than or equal to 500° C., and
   a chemical or chemical-mechanical thinning of one of the first and second wafers.

* * * * *